United States Patent
Kudryashov et al.

(10) Patent No.: US 10,727,649 B2
(45) Date of Patent: Jul. 28, 2020

(54) MONOLITHIC SERIES-CONNECTED EDGE-EMITTING-LASER ARRAY AND METHOD OF FABRICATION

(71) Applicant: ARGO AI, LLC, Pittsburgh, PA (US)

(72) Inventors: Igor Kudryashov, Pennington, NJ (US); John Hostetler, Hightstown, NJ (US)

(73) Assignee: ARGO AI, LLC, Pittsburgh ( * ) Notice: Subject to any disclaimer, the term of this patent is extended or adjusted under 35 U.S.C. 154(b) by 0 days.

(21) Appl. No.: 16/138,018

(22) Filed: Sep. 21, 2018

(65) Prior Publication Data
US 2020/0099197 A1    Mar. 26, 2020

(51) Int. Cl.
*H01S 5/183*    (2006.01)
*H01S 5/40*    (2006.01)
*H01S 5/42*    (2006.01)

(52) U.S. Cl.
CPC ........ *H01S 5/4031* (2013.01); *H01S 5/18308* (2013.01); *H01S 5/4018* (2013.01); *H01S 5/423* (2013.01)

(58) Field of Classification Search
CPC .... H01S 5/4031; H01S 5/423; H01S 5/18308; H01S 5/4018
See application file for complete search history.

(56) References Cited

U.S. PATENT DOCUMENTS

| | | | |
|---|---|---|---|
| 4,306,278 A | 12/1981 | Fulton et al. | |
| 5,309,457 A | 5/1994 | Minch | |
| 5,455,429 A * | 10/1995 | Paoli | H01L 27/0605 257/192 |
| 5,593,901 A | 1/1997 | Oswald et al. | |
| 5,642,373 A | 6/1997 | Kamizato et al. | |
| 5,734,672 A | 3/1998 | McMinn et al. | |
| 5,923,692 A | 7/1999 | Staskus et al. | |
| 2007/0176262 A1 | 8/2007 | Sirkin | |
| 2008/0025361 A1 | 1/2008 | Jerman et al. | |
| 2011/0274131 A1 | 11/2011 | Takaki et al. | |

(Continued)

FOREIGN PATENT DOCUMENTS

JP    63-306687 A    12/1988

OTHER PUBLICATIONS

Combined Search and Examination Report issued in counterpart GB application No. 1913374.3, dated Feb 28, 2020, 10 pp.

*Primary Examiner* — Xinning(Tom) Niu
(74) *Attorney, Agent, or Firm* — Kaplan Breyer Schwarz, LLP (57) ABSTRACT

A monolithic series-connected laser-diode array is presented, where the array is formed on a non-conductive substrate that includes a plurality of discrete electrically conductive regions. Each laser diode of the array is disposed on a different conductive region such that the laser cavity of each laser diode is optically isolated from its respective conductive region, thereby avoiding optical loss in the laser cavity due to interaction with the highly doped conductive material. Each conductive region is configured to extend past the lateral extent of its respective laser-diode structure. Electrical connection between adjacent laser diodes of the array is made by forming a conductive trace that extends from the top contact of one of the laser diodes to the conductive region on which the other laser diode is disposed.

20 Claims, 7 Drawing Sheets

Sectional View through a-a (56) References Cited

U.S. PATENT DOCUMENTS

| | | | |
|---|---|---|---|
| 2012/0128016 A1* | 5/2012 | Adachi | B82Y 20/00 |
| | | | 372/43.01 |
| 2015/0110140 A1* | 4/2015 | Letsch | H01S 5/4018 |
| | | | 372/38.1 |
| 2016/0156157 A1 | 6/2016 | Matsubara et al. | |

* cited by examiner

FIG. 2B  Sectional View through a-a

FIG. 4E  Sectional View through b-b

MONOLITHIC SERIES-CONNECTED EDGE-EMITTING-LASER ARRAY AND METHOD OF FABRICATION

TECHNICAL FIELD

The present disclosure relates to semiconductor lasers in general, and, more particularly, to monolithic semiconductor laser arrays and their fabrication.

BACKGROUND

Laser-diode arrays are attractive for use in many applications, such as laser range finding (e.g., LiDAR, etc.), material processing, laser pumping, illumination, 3D imaging, gaming, and medicine, among others.

Typically, conventional laser-diode arrays are electrically driven in parallel, where all laser diodes are biased with the same voltage but each receives a different electric current (hereinafter referred to as simply "current"). Unfortunately, the aggregate current required for such an arrangement becomes impractical as the size of a laser-diode array increases—particularly for high-optical-power applications such as LiDAR. For example, an array of 20 laser diodes, each requiring 20 amps of current per device, requires an aggregate current of 400 Amps, while an array of 100 laser diodes that require 50 amps per device requires an aggregate current of 5000 Amps.

Such high-current requirements lead to significant complications at the system level. High-current power supplies and their associated cabling are prohibitively bulky and expensive for many applications. Miniaturization of power supplies and cabling is possible in some applications that require only short pulse, low duty-cycle operation (nano- to micro-seconds) because the total average power is low. Unfortunately, even for short-pulse power supplies, the ability to reach kA is still challenging.

As a result, laser-diode arrays have been developed such that their emitters are electrically connected in series, wherein a single voltage is applied across an entire string of serially connected laser diodes and the elements of the string share the same current. Typically, this is done by bonding individual emitter chips onto a common substrate and electrically connecting them via conventional wire bonding technology. Such an arrangement can dramatically reduce the current requirements for a laser-diode array while still delivering high current to each device.

Unfortunately, monolithic series-connected laser-diode arrays have proven to be difficult to fabricate in practice. As a result, electrically connecting the elements of a laser-diode array in series are normally based on conventional electrical approaches.

In some approaches, individual laser diodes are mounted onto an electrically insulating substrate on which a conductive pattern is defined. The bottom contact of each laser diode is electrically connected to a different electrically isolated region of the pattern. Conventional external electrical connections (e.g., wire bonds, tab bonds, ribbons, etc.) are then made between the top contact of each device and the region of the conductive pattern to which the bottom contact of the preceding laser diode in the string is electrically connected, thereby realizing a series-connected string of singulated laser diodes.

Another conventional approach for realizing a series-connected laser-diode string includes mounting a parallel laser array to the insulating substrate, followed by singulating the laser diodes (e.g., by sawing, laser cutting, etc.) to electrically isolate each laser diode from its neighbors. The electrically isolated laser diodes are then electrically connected in series using external electrical connections, as described above.

Such conventional approaches require complex packaging methods and external electrical connections, both of which increase size, cost and complexity of the series connected devices. Furthermore, external electrical connections, such as wire bonds and the like, introduce parasitic electrical issues that can limit short-pulse, high-current, high-frequency operation.

The need for a practical, low-cost, series-connected laser diode array suitable for a broad range of applications remains, as yet, unmet in the prior art.

SUMMARY

The present disclosure enables a plurality of laser diodes to be driven with the same flow of electric current without some of the costs and disadvantages of the prior art. Embodiments in accordance with the present disclosure are particularly well suited for use in applications such as LiDAR, medical imaging, illumination, and gaming, among others.

Like series-connected laser-diode arrays known in the prior art, embodiments in accordance with the present disclosure include a plurality of laser diodes, each of which is formed on a conductive region that is electrically connected to, or a part of, the bottom contact of its respective laser diode. Each conductive region extends beyond the perimeter of its corresponding laser diode structure. The laser diodes are electrically connected in series by forming traces that extend from each conductive region to the top contact of a different laser diode. Unfortunately, each highly doped prior-art conductive regions is located within the laser cavity of its respective laser diode; therefore, dopant-induced absorption in the conduction region impairs the optical mode that develops within the laser cavity and significantly degrades the performance of the laser. Alternatively, the highly-doped conduction layer can be thinner to help reduce optical losses in the laser cavity, but thin layers then introduce high electrical resistance for lateral electrical conduction needed for series connections.

In sharp contrast to the prior-art, however, the conductive regions disclosed herein are located outside the laser cavities of their respective laser diodes; therefore the conductive material of each conductive region is optically decoupled from its respective laser cavity. As a result, no absorption of light within the laser cavity by the conductive regions occurs, which enables improved laser performance as compared to the prior art. Furthermore, because they do not affect the optical mode of the lasers, the conductive regions of the present disclosure can be more highly doped, enabling them to be thinner without sacrificing electrical conductivity.

An illustrative embodiment in accordance with the present disclosure is an array of edge-emitting (i.e., side-emitting) laser diodes that are monolithically integrated on a common substrate and electrically connected in series. The substrate is a semi-insulating semiconductor substrate having a plurality of electrically conductive regions formed within the substrate at its top surface via ion implantation. Because the substrate material is non-conductive, the conductive regions are not electrically coupled through the substrate itself.

The layer structure of the laser-diode array is epitaxially grown on the conductive regions and patterned to separate the individual laser diodes, as well as expose a portion of each conductive region, which function as the bottom contacts of the laser diodes. Each conductive region is electrically coupled with the top contact of a different laser diode to realize a serial string of laser diodes that can be driven with a single, common current flow.

The layer structure of each laser diode includes a waveguide layer that terminates at two end vertically oriented end facets to define a laser cavity whose optical mode is oriented laterally, i.e. a side emitter. The waveguide layer is located between bottom and top cladding layers, which have refractive indices that are lower than that of the waveguide layer. As a result, the cladding layers substantially confine the optical mode of the laser cavity within the waveguide layer itself, thereby ensuring that the laser cavity is optically decoupled from its respective lateral conductive region.

In some embodiments, the epitaxially grown laser structure includes a bottom contact layer. The laser diodes are formed such that the bottom of each device is at least in partial physical and electrical contact with its respective conductive region.

In some embodiments, the conductive regions are formed by epitaxially growing a conductive layer over the entire top surface of the substrate. In some of these embodiments, the electrically discrete conductive regions are then formed by patterning the conductive layer. In some of these embodiments, the electrically discrete conductive regions are formed within the full-surface conductive layer by performing proton implantation in all areas of the layer except for the conductive regions. In some of these embodiments, dopant of the opposite type is implanted in all areas of the layer except for the conductive regions to create p-n junctions at the border of each conductive region. In some embodiments, the conductive regions are formed by selective-area growth within trenches formed in the top surface of the substrate.

An embodiment in accordance with the present disclosure is a monolithic series-connected laser-diode array comprising: a substrate having a first region that is electrically conductive and a second region that is electrically conductive, wherein the first and second regions are not electrically coupled through the substrate; a first laser diode including a first waveguide layer, a first bottom contact, and a first top contact, wherein the first laser diode is disposed on the first region such that the first region defines at least a portion of the first bottom contact, and wherein the first laser diode includes a first laser cavity that is optically decoupled from the first region; a second laser diode including a second waveguide layer, a second bottom contact, and a second top contact, wherein the second laser diode is disposed on the second region such that the second region defines at least a portion of the second bottom contact, and wherein the second laser diode includes a second laser cavity that is optically decoupled from the second region; and a trace that is configured to electrically connect the first region and the second top contact.

Another embodiment in accordance with the present disclosure is a monolithic series-connected laser-diode array comprising: a substrate comprising a plurality of first regions that are electrically conductive, wherein no two first regions of the plurality thereof are electrically coupled through the substrate; a plurality of laser diodes, each laser diode characterized by a laser cavity and including a waveguide layer configured to enable optical gain, a bottom contact, and a top contact, and each laser diode being disposed on at least a portion of a different first region of the plurality thereof such that its bottom contact is electrically connected with its respective first region and its laser cavity is optically isolated from its respective first region; and a plurality of traces, wherein each trace is configured to electrically connect a different first region of the plurality thereof with the top contact of a laser diode disposed on a different first region of the plurality thereof such that the plurality of laser-diodes is electrically connected in series.

Yet another embodiment in accordance with the present disclosure is a method for forming a monolithic series-connected laser-diode array, the method including: providing substrate comprising a plurality of first regions that are electrically conductive, wherein no two first regions of the plurality thereof are electrically connected through the substrate; forming a plurality of laser diodes such that each laser diode is disposed on at least a portion of a different first region of the plurality thereof, wherein each laser diode of the plurality thereof has (i) a bottom contact that includes at least a portion of its respective first region, (ii) a waveguide layer that is configured to provide optical gain, and (iii) a top contact, and wherein each laser diode of the plurality thereof is characterized by a laser cavity that is optically decoupled from its respective first region; and forming a trace between the top contact of each laser diode of the plurality thereof and a first region of the plurality thereof other than the first region on which the laser diode is disposed.

DETAILED DESCRIPTION

The following terms are defined for use in this Specification, including the appended claims:
  Disposed on or Formed on is defined as "exists on" an underlying material or layer either in direct physical contact or with one or more intervening layers. For example, if a material is described to be "disposed (or grown) on a substrate," this can mean that either (1) the material is in intimate contact with the substrate; or (2) the material is in contact with one or more layers that already reside on the substrate.
  Monolithically integrated is defined as formed either: in the body of a substrate, typically by etching into the substrate and/or; on the surface of the substrate, typically by patterning one or more layers disposed on the surface. Term "monolithically integrated" explicitly excludes hybrid integration wherein one or more devices are joined to a common substrate via conventional hybrid packaging methods, such as solder-bump bonding, gluing, die attachment, and the like.

Figure 1:
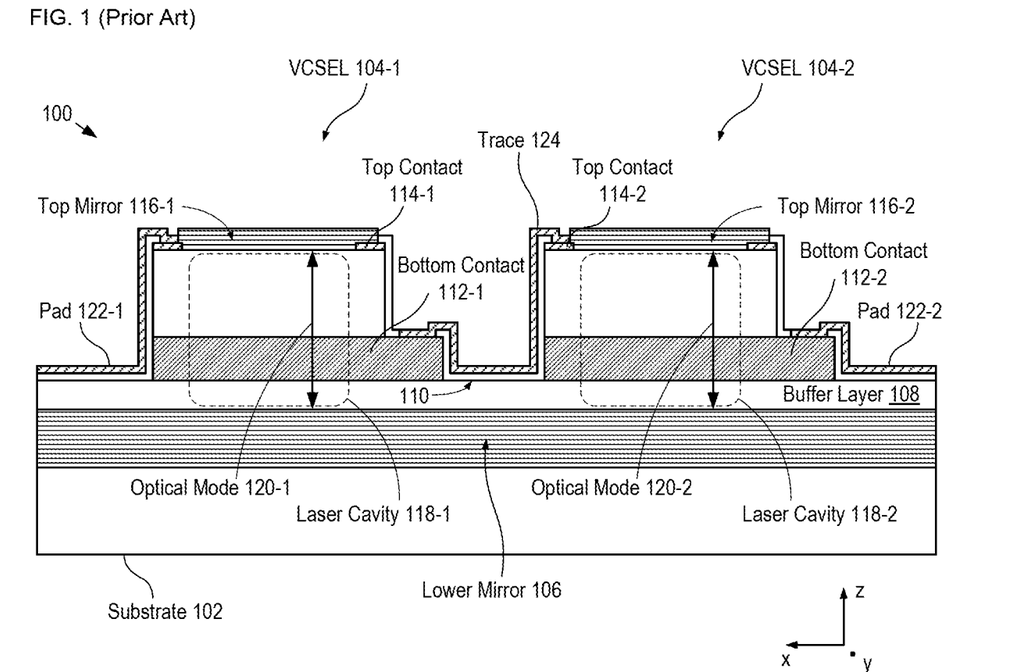
FIG. 1 depicts a schematic drawing of a cross-sectional view of a laser-diode array in accordance with the prior art.

FIG. 1 depicts a schematic drawing of a cross-sectional view of a laser-diode array in accordance with the prior art. Array 100 includes substrate 102 and vertical-cavity surface-emitting lasers (VCSEL) 104-1 and 104-2. Array 100 is analogous to prior-art laser-diode arrays disclosed, for example, in U.S. Patent Publication 20110274131, which is incorporated herein by reference.

Substrate 102 is an undoped gallium arsenide (GaAs) substrate that includes lower mirror 106 and buffer layer 108.

Lower mirror 106 is a multi-layer distributed Bragg reflector (DBR) that includes a plurality of repeating pairs of epitaxially grown semiconductor layers, such as GaAs and aluminum gallium arsenide (AlGaAs).

Buffer layer 108 is a layer of undoped GaAs that is epitaxially grown on top of lower mirror 106.

Each of VCSEL 104-1 and VCSEL 104-2 is formed on surface 110 of buffer layer 108 via epitaxial growth. Each VCSEL includes a conventional layer structure that is sandwiched between a bottom contact 112 and a top contact 114.

Bottom contacts 112-1 and 112-2 are patterned from a full-surface layer of n-doped GaAs formed on surface 110. Bottom contacts 112-1 and 112-2 are patterned such that they extend laterally past the perimeter of VCSELs 104-1 and 104-2, respectively. Preferably, the material that composes bottom contacts 112-1 and 112-2 is heavily doped such that it is highly conductive; however, as discussed below, the doping level for these contacts is typically kept relatively low to avoid dopant-related optical absorption effects.

Top contacts 114-1 and 114-2 are "ring" contacts comprising an annular pattern of conductive material (typically metal) disposed on the outer perimeter of the top surface of VCSELs 104-1 and 104-2, respectively.

Each of top mirrors 116-1 and 116-2 is a DBR mirror comprising a plurality of repeating pairs of dielectric layers, such as silicon nitride and silicon dioxide. Top mirror 116-1 is formed on the top surface of VCSEL 104-1 and top mirror 116-2 is formed on the top surface of VCSEL 104-2.

VCSEL 104-1 is characterized by laser cavity 118-1, which his defined by top mirror 116-1 and a first portion of DBR mirror 106. In similar fashion, VCSEL 104-2 is characterized by laser cavity 118-2, which his defined by top mirror 116-2 and a second portion of DBR mirror 106. Laser cavity 118-1 supports the development of optical mode 120-1, while laser cavity 118-2 supports the development of optical mode 120-2. Each of optical modes 120-1 and 120-2 is oriented vertically (i.e., aligned with the z-direction).

VCSELs 104-1 and 104-2 are electrically connected in series between pads 122-1 and 122-2 via trace 124, which extends between and electrically connects bottom contact 112-1 and top contact 114-2.

Unfortunately, the bottom contact of each of VCSEL 104-1 and 104-2 resides within its laser cavity. As a result, bottom contact 112-1 is optically coupled with laser cavity 118-1 such that it is part of the structure that supports optical mode 120-1, while bottom contact 112-2 is optically coupled with laser cavity 118-2 such that it is part of the structure that supports optical mode 120-2. This gives rise to two significant disadvantages.

First, significant absorption of the optical energy of optical modes 120-1 and 120-2 is absorbed in the doped material of bottom contacts 112-1 and 112-2. As a result, the performance of VCSELs 104-1 and 104-2 is degraded significantly.

Second, in order to mitigate this absorption, the doping level for the bottom contacts is typically kept below what would normally be desired for a conductive semiconductor region. As a result, these regions must be made thicker than would normally be desirable in order to provide sufficiently low resistance in bottom contacts 112-1 and 112-2.

It is an aspect of the present disclosure, however, that by forming a laser-diode array on a plurality of conductive regions that are located outside of their laser cavities, the problems associated with prior-art series-connected laser-diode arrays can be mitigated or avoided altogether.

Figure 2A:
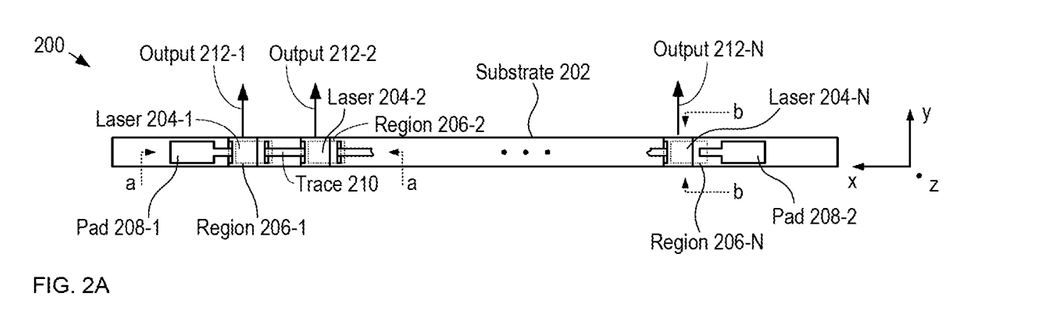
FIG. 2A depicts a schematic drawing of a top view of an illustrative embodiment of a monolithic series-connected laser-diode array in accordance with the present disclosure.

FIG. 2A depicts a schematic drawing of a top view of an illustrative embodiment of a monolithic series-connected laser-diode array in accordance with the present disclosure. Array 200 includes substrate 202 and laser diodes 204-1 through 204-N, where N is any practical number.

Figure 2B:
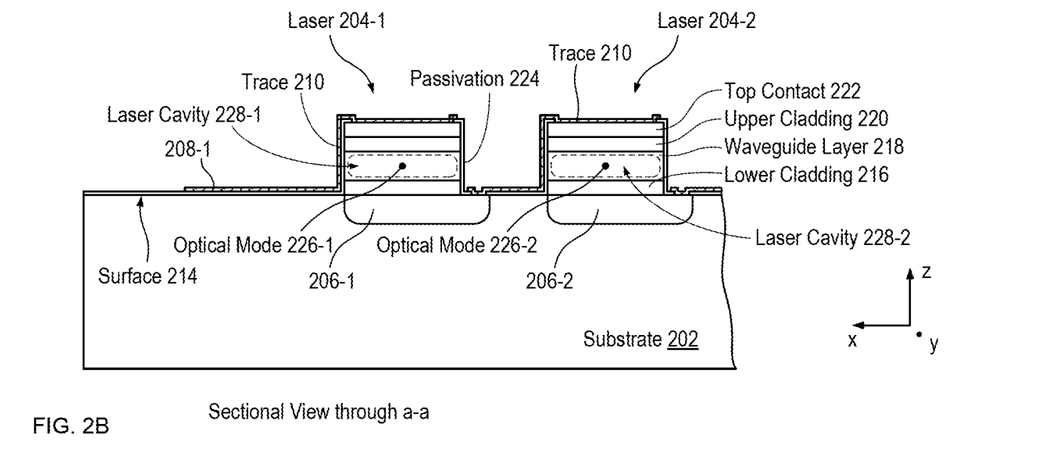
FIG. 2B depicts a schematic drawing of a sectional view of a portion of array 200.

FIG. 2B depicts a schematic drawing of a sectional view of a portion of array 200. The sectional view depicted in FIG. 2B is taken through line a-a shown in FIG. 2A.

Each of laser diodes 204-1 through 204-N (hereinafter referred to as lasers 204-1 through 204-N and, collectively, as lasers 204) is an indium-phosphide-based edge-emitting laser diode that emits a high-power laser signal having a wavelength within the range of approximately 1250 nm to approximately 1660 nm. In the depicted example, laser 204 are configured to provide output peak power within the range of approximately 10 W to approximately 50 W.

It should be noted, however, that lasers 204 are merely exemplary and other embodiments in accordance with the present disclosure can include other types of lasers (e.g., VCSELs, etc.), be based on material systems other than indium phosphide (e.g., gallium arsenide (GaAs, etc.), emit output signals having other wavelengths, and/or provide other output power levels without departing from its scope. It should be noted that the application of the teachings of this disclosure is not limited to laser arrays. For example, arrays of semiconductor amplifiers, optical modulators, and the like, could be formed without departing from the scope of the present disclosure.

Figure 3:
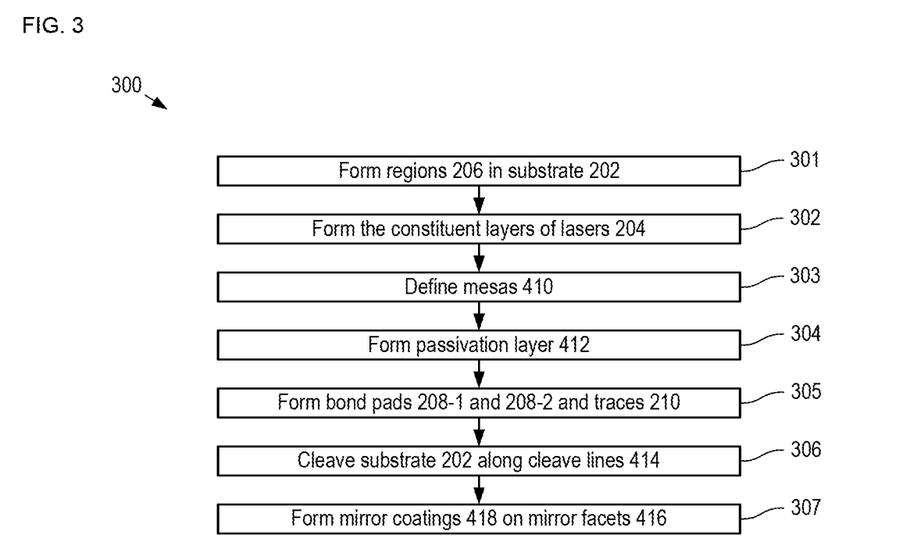
FIG. 3 depicts operations of a method suitable for forming a series-connected laser-diode array in accordance with the illustrative embodiment.

FIG. 3 depicts operations of a method suitable for forming a series-connected laser-diode array in accordance with the illustrative embodiment.

FIGS. 4A-E depict schematic drawings of portions of nascent array 200 at different stages of its fabrication.

Method 300 is described herein with continuing reference to FIGS. 2A-B, as well as reference to FIGS. 4A-E.

Method 300 begins with operation 301, wherein regions 206-1 through 206-N (referred to, collectively, as regions 206) are formed in substrate 202.

Substrate 202 is an insulating compound-semiconductor substrate suitable for planar processing and for electrical isolating regions 206 such that no two regions are electrically coupled through substrate 202. In the depicted example, substrate 202 is an undoped indium phosphide (InP) substrate. In some embodiments, substrate 202 is a semi-insulating compound-semiconductor substrate and/or comprises a material other than InP.

Regions 206 are non-contiguous, electrically discrete (i.e., electrically disconnected), electrically conductive islands located at surface 214 of substrate 202. In the depicted example, regions 206 are regions of the substrate made highly conductive (preferably, less than or equal to $1\times10^{-3}$ Ω-cm) by heavily doping them with an n-type dopant via conventional patterned ion implantation (i.e., ion implantation performed through a mask, such as a shadow mask, photoresist, or dielectric mask, and the like). In the depicted example, regions 206 are doped with silicon;

however, in some embodiments, regions 206 are doped with a different n-type dopant (e.g., sulfur, etc.). In some embodiments, the layer structure of lasers 204 is p-down; therefore, regions 206 are doped with a p-type dopant.

After ion implantation, substrate 202 is typically annealed to repair any damage to the crystal structure of the substrate material.

Figure 4A:
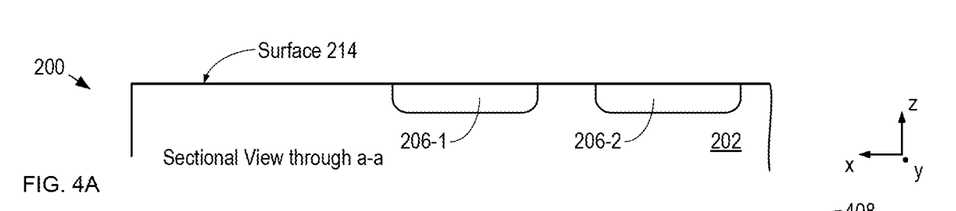
FIGS. 4A-E depict schematic drawings of portions of nascent array 200 at different stages of its fabrication.

FIG. 4A depicts a sectional view of a portion of nascent array 200 after the formation of regions 206 in substrate 202 via patterned ion implantation. The sectional view shown in FIG. 4A is taken through line a-a shown in FIG. 2A.

Figure 4B:
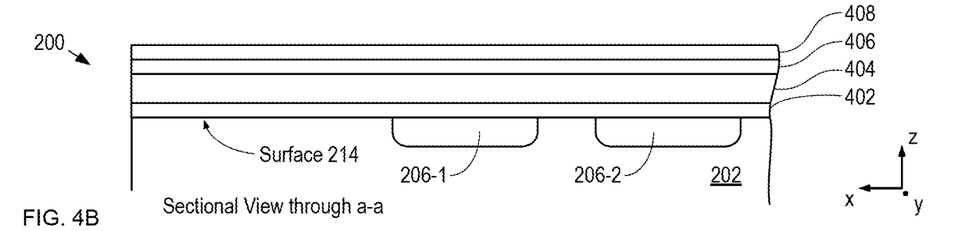

At operation 302, the constituent layers of lasers 204 are sequentially formed as full-surface layers on surface 214 and regions 206 via epitaxial growth. In the depicted example, the constituent layers of lasers 204 include lower cladding layer 402, waveguide layer 404, upper cladding 406, and top contact layer 408. In some embodiments, the constituent layers of lasers 204 include one or more additional layers.

Lower cladding layer 402 is a layer of n-doped InP. In the depicted example, lower cladding layer 402 has a dopant concentration of $1 \times 10^{18}$ cm$^{-3}$ and a thickness that is approximately 1 micron. In some embodiments, lower cladding layer 402 has a different doping concentration and/or thickness. Typical doping concentrations for lower cladding layer 402 are within the range of approximately $2 \times 10^{17}$ cm$^{-3}$ to approximately $5 \times 10^{18}$ cm$^{-3}$.

Waveguide layer 404 is a layer of lightly doped indium gallium arsenide phosphide (InGaAsP) that includes a quantum-well region. Waveguide layer 404 is configured to provide optical gain at the desired lasing wavelength of lasers 204 and support a laterally oriented optical mode 226 in its respective laser cavity 228 (i.e., the optical mode is in the x-y plane). In the depicted example, waveguide layer 404 has a dopant concentration of $5 \times 10^{16}$ cm$^{-3}$ and a thickness of approximately 4 microns. In some embodiments, waveguide layer 404 has a different doping concentration and/or thickness. Typical doping concentrations for waveguide layer 404 are within the range of approximately $1 \times 10^{16}$ cm$^{-3}$ to approximately $2 \times 10^{17}$ cm$^{-3}$. In some embodiments, waveguide layer 404 comprises a material other than InGaAsP, such as aluminum gallium indium arsenide (AlGaInAs), etc. In some embodiments, waveguide layer 404 is substantially undoped.

Upper cladding layer 406 is a layer of p-doped InP. In the depicted example, upper cladding layer 406 has a dopant concentration of $5 \times 10^{17}$ cm$^{-3}$ and a thickness of approximately 1 micron. In some embodiments, upper cladding layer 406 has a different doping concentration and/or thickness. Typical doping concentrations for upper cladding layer 406 are within the range of approximately $2 \times 10^{17}$ cm$^{-3}$ to approximately $5 \times 10^{18}$ cm$^{-3}$.

Top contact layer 408 is a heavily p-doped layer of InGaAs. In the depicted example, top contact layer 408 has a dopant concentration of approximately $1 \times 10^{19}$ cm$^{-3}$.

The constituent layers of lasers 204 are formed such that the refractive index of waveguide layer 404 is higher than that of both lower cladding layer 402 and upper cladding layer 406. As a result, the three layers collectively define a waveguide structure that confines substantially all of the optical energy of the optical mode of each of lasers 204 such that its laser cavity is optically isolated from its bottom contact 206.

It is an aspect of the present disclosure that, by forming lasers 204 such that each of their laser cavities are optically isolated from its respective bottom contact 206, embodiments in accordance with the present disclosure derive several important advantages over prior-art laser-diode arrays.

First, none of the optical energy of optical mode 226 is absorbed by bottom contact 206. As a result, the performance of lasers 204 is not degraded by their formation of the bottom contacts.

Second, bottom contacts 206 can be more highly doped than bottom contacts in the prior art. As a result, bottom contacts 206 can have lower resistivity.

Third, bottom contacts 206 can be made thicker (within practical limitations of cost and processing complexity) to realize low-resistance contacts having extremely low lateral resistance.

As noted above, the teachings of the present disclosure are applicable to structures other than edge-emitting laser diodes, such as VCSELs, optical modulators, semiconductor amplifiers, and the like. In some cases, the constituent layers of such structures are defined to maintain the condition that the bottom contacts are not optically coupled with the optical mode of the device. For example, when applied to the formation of a series-connected VCSEL array, the constituent layers of each VCSEL include a bottom mirror layer (e.g., a DBR mirror) that is formed such that it is disposed on the bottom contact of that VCSEL and, therefore, the bottom contact is outside of the laser cavity of the VCSEL.

It should be noted that the doping concentrations and thicknesses provided above for the constituent layers of lasers 204 are merely exemplary and that other doping concentrations and/or thicknesses can be used for one or more of these layers without departing from the scope of the present disclosure.

FIG. 4B depicts a sectional view of a portion of nascent array 200 after the epitaxial deposition of the constituent layers of laser diodes 204. The sectional view shown in FIG. 4B is taken through line a-a shown in FIG. 2A.

Figure 4C:
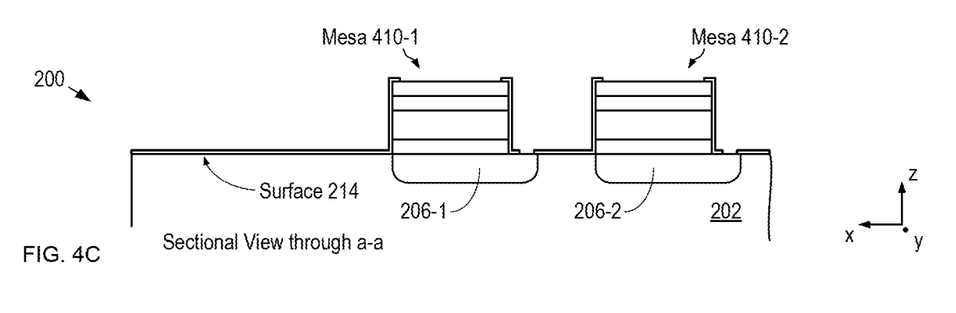

At operation 303, mesas 410-1 through 410-N (referred to, collectively, as mesas 410) are defined by patterning layers 402-408 in conventional fashion. Mesas 410 are defined such that a portion of each of bottom contacts 206 is exposed.

At operation 304, passivation layer 412 is formed in conventional fashion. Passivation layer 412 is patterned such that it protects the sidewalls of each of mesa but exposes at least a portion of each of bottom contacts and at least a portion of each of the top surfaces of mesas 410.

FIG. 4C depicts a sectional view of a portion of nascent array 200 after the formation of mesas 410 and passivation layer 412. The sectional view shown in FIG. 4C is taken through line a-a shown in FIG. 2A.

Figure 4D:
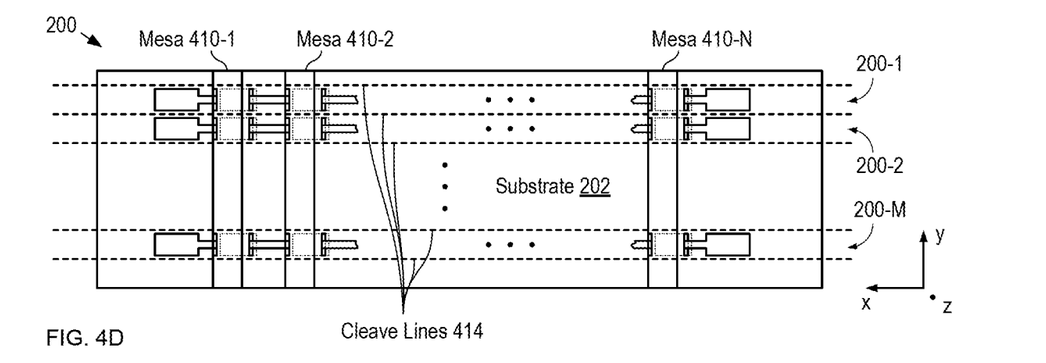

At operation 305, bond pads 208-1 and 208-2 and traces 210 are formed to electrically connect laser diodes 204 in series between the bond pads.

FIG. 4D depicts a top view of a substrate having a plurality of nascent laser-diode arrays after definition of their bonds pads and traces. As shown in FIG. 4D, array 200 is typically formed as one of many substantially identical laser-diode arrays (i.e., arrays 200-1 through 200-M, where M is any practical number), which are formed simultaneously on a common substrate (i.e., substrate 202).

At operation 306, substrate 202 is cleaved along cleave lines 414.

Figure 4E:
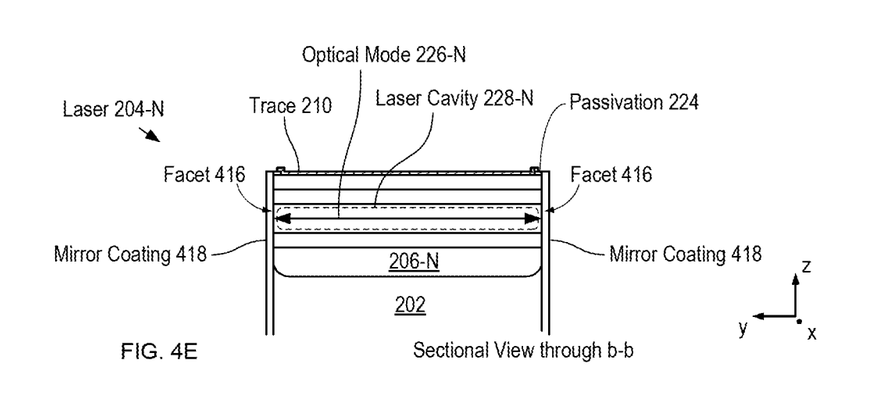

Cleaving substrate 202 singulates different laser-diode arrays formed on the substrate. In addition, it also forms mirror facets 416 at each end of the laser cavity of each laser diode 204.

At optional operation 307, lasers 204 are completed by forming mirror coatings 418, typically Bragg reflectors, on each of its mirror facets 416 to improve their reflectivity for optical mode 226.

FIG. 4E depicts a sectional view of laser diode 204-N after substrate 202 has been cleaved and mirror coatings 418 have been formed. The sectional view shown in FIG. 4E is taken through line b-b shown in FIG. 2A.

In some embodiments, regions 206 are formed in substrate 202 by a method other than patterned ion implantation. For example, in some embodiments, regions 206 are defined form a conductive layer formed such that it is a full-surface layer disposed on surface 214. In some embodiments, regions 206 are formed by selective-area growth on surface 214 or within trenches formed into the body of substrate 202.

Figure 5:
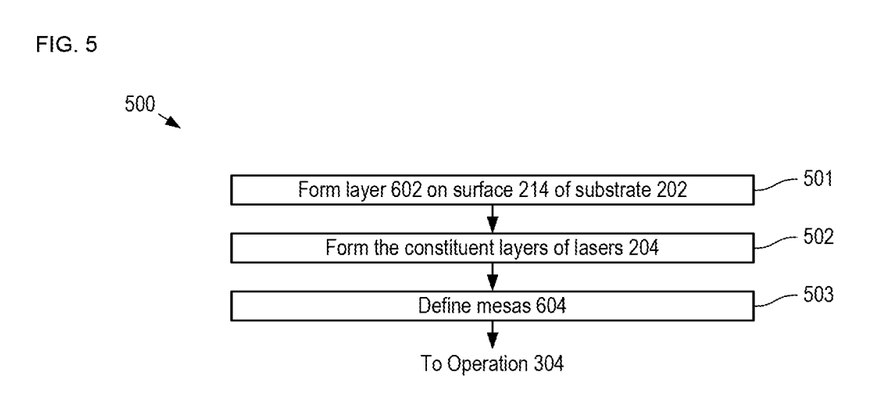
FIG. 5 depicts operations of a method suitable for forming a series-connected laser-diode array in accordance with an alternative embodiment in accordance with the present disclosure.

FIG. 5 depicts operations of a method suitable for forming a series-connected laser-diode array in accordance with an alternative embodiment in accordance with the present disclosure.

Figure 6A:
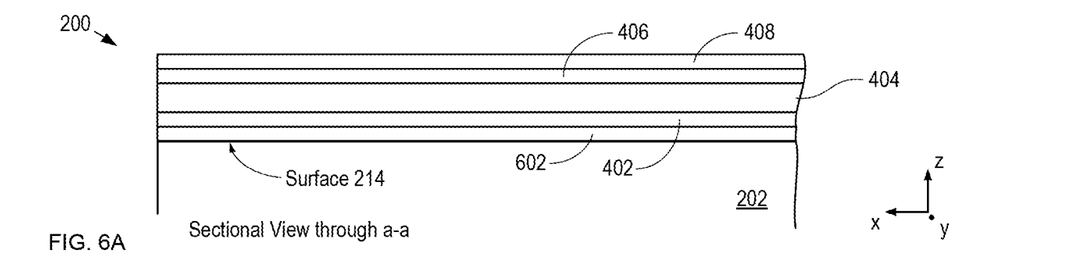
FIGS. 6A-B depict schematic drawings of portions of nascent array 200 at different stages of its fabrication.
Figure 6B:
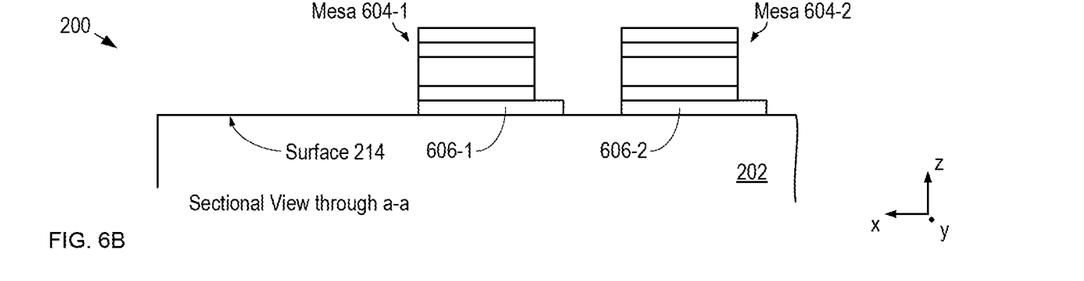

FIGS. 6A-B depict schematic drawings of portions of nascent array 200 at different stages of its fabrication.

Method 500 is described herein with continuing reference to FIGS. 2A-B, as well as reference to FIGS. 6A-B.

Method 500 begins with operation 501, wherein layer 602 is formed on surface 214 of substrate 202. In the depicted example, layer 602 is a layer of heavily n-doped InP or InGaAs grown on surface 214 via conventional epitaxial growth. In some embodiments, layer 602 is formed by performing unpatterned ion implantation to heavily dope the top portion of substrate 202.

At operation 502, the constituent layers of lasers 204 are sequentially formed as full-surface layers on layer 602, as discussed above and with respect to operation 302.

FIG. 6A depicts a schematic drawing of a sectional view of nascent array 200 after the formation of full-surface layers 602, 402, 404, 406, and 408. The sectional view shown in FIG. 6A is taken through line a-a shown in FIG. 2A.

At operation 503, mesas 604-1 through 604-N (referred to, collectively, as mesas 604) are defined by patterning layers 402-408 in conventional fashion. Mesas 604 are defined such that conductive layer 602 is exposed except where the mesas reside.

At operation 504, layer 602 is patterned to define regions 606-1 through 606-N (referred to, collectively, as regions 606). Regions 606 are analogous to regions 206 described above. A portion of each of regions 606 extends past the perimeter of its respective mesa 604. Typically, the material of layer 602 is completely removed from surface 214 except for regions 606. As a result, regions 606 are electrically discrete (i.e., they are not electrically connected via substrate 202).

FIG. 6B depicts a schematic drawing of a sectional view of nascent array 200 after the definition of mesas 604 and regions 606. The sectional view shown in FIG. 6B is taken through line a-a shown in FIG. 2A.

Once mesas 604 and regions 606 are defined, method 500 continues with operations 304 through 307, as described above and with respect to method 300.

In some embodiments, conductive regions 606 are made electrically discrete within full-surface layer 602 by performing proton implantation over the entirety of the layer except for those regions desired to remain conductive (i.e., conductive regions 606). Alternatively, dopant of the opposite type from that of layer 602 can be used instead of protons to create p-n junctions at the borders of each of conductive regions 606. As a result the conductive regions are electrically connected to one another via a pair of back-to-back diodes that will inhibit current flow between them. In both such embodiments, operation 504 is unnecessary and method 600 can proceed from 503 directly to operation 304.

It is to be understood that the disclosure teaches just some examples of embodiments in accordance with the present invention and that many variations of the invention can easily be devised by those skilled in the art after reading this disclosure and that the scope of the present invention is to be determined by the following claims.

What is claimed is:

1. A monolithically intearated series-connected laser-diode array comprising:
  a substrate having a first region that is electrically conductive and a second region that is electrically conductive, wherein the first and second regions are not electrically coupled through the substrate;
  a first epitaxially grown laser diode including a first waveguide layer, a first bottom contact, and a first top contact, wherein the first laser diode is disposed on the first region such that the first region defines at least a portion of the first bottom contact, and wherein the first laser diode includes a first laser cavity that is optically decoupled from the first region;
  a second epitaxially grown laser diode including a second waveguide layer, a second bottom contact, and a second top contact, wherein the second laser diode is disposed on the second region such that the second region defines at least a portion of the second bottom contact, and wherein the second laser diode includes a second laser cavity that is optically decoupled from the second region; and
  a trace that is configured to electrically connect the first region and the second top contact.

2. The laser-diode array of claim 1 wherein the first laser diode is an edge-emitting laser diode.

3. The laser-diode array of claim 1 wherein the first laser diode includes a cladding layer that is between the first region and the first laser cavity.

4. The laser-diode array of claim 1 wherein the first region defines a first plane, and wherein the first laser cavity is characterized by an optical mode that is parallel with the first plane.

5. The laser-diode array of claim 1 wherein the first laser diode includes a cleaved facet that defines at least a portion of a mirror of the laser cavity.

6. The laser-diode array of claim 1 wherein the first region is an ion-implanted region.

7. The laser-diode array of claim 1 wherein the first region is an epitaxially grown region.

8. A monolithically integrated series-connected laser-diode array comprising:
  a substrate comprising a plurality of first regions that are electrically conductive, wherein no two first regions of the plurality thereof are electrically coupled through the substrate;
  a plurality of epitaxially grown laser diodes, each laser diode characterized by a laser cavity and including a bottom cladding layer that is doped with a first dopant, a top cladding layer that is doped with a second dopant, a waveguide layer configured to enable optical gain, the waveguide layer being between the bottom and top cladding layers, a bottom contact, and a top contact, and each laser diode being disposed on at least a portion of a different first region of the plurality thereof such that its bottom contact is electrically connected with its respective first region and its laser cavity is optically isolated from its respective first region; and a plurality of traces, wherein each trace is configured to electrically connect a different first region of the plurality thereof with the top contact of a laser diode disposed on a different first region of the plurality thereof such that the plurality of laser-diodes is electrically connected in series.

9. The laser-diode array of claim 8 wherein each laser diode of the plurality thereof is an edge-emitting laser diode.

10. The laser-diode array of claim 8 wherein each laser diode of the plurality thereof includes first and second cladding layers, and wherein the waveguide layer is between the first and second cladding layers.

11. The laser-diode array of claim 8 wherein each first region of the plurality thereof is an ion-implanted region.

12. The laser-diode array of claim 8 wherein each first region of the plurality thereof is an epitaxially grown region.

13. The laser-diode array of claim 8 wherein each bottom contact of the plurality thereof includes at least a portion of a different first region of the plurality thereof.

14. A method for forming a monolithically integrated series-connected laser-diode array, the method including:

providing substrate comprising a plurality of first regions that are electrically conductive, wherein no two first regions of the plurality thereof are electrically connected through the substrate;

forming a plurality of laser diodes such that each laser diode is epitaxially grown on at least a portion of a different first region of the plurality thereof, wherein each laser diode of the plurality thereof has (i) a bottom contact that includes at least a portion of its respective first region, (ii) a waveguide layer that is configured to provide optical gain, and (iii) a top contact, and wherein each laser diode of the plurality thereof is characterized by a laser cavity that is optically decoupled from its respective first region; and forming a trace between the top contact of each laser diode of the plurality thereof and a first region of the plurality thereof other than the first region on which the laser diode is disposed.

15. The method of claim 14 wherein at least one of the plurality of laser diodes is an edge-emitting laser diode.

16. The method of claim 14 wherein the substrate is provided by operations including:

providing the substrate such that it is selected from the group consisting of an insulating substrate and a semi-insulating substrate;

forming a first layer on a first surface of the substrate, wherein the first layer is formed as an electrically conductive layer; and patterning the first layer to define the plurality of first regions.

17. The method of claim 14 wherein the substrate is provided by operations including:

providing the substrate such that it is selected from the group consisting of an insulating substrate and a semi-insulating substrate;

forming a first layer on a first surface of the substrate, wherein the first layer is formed as an electrically conductive layer; and forming at least one second region in the first layer, wherein the at least one electrically second region is electrically non-conductive and electrically isolates at least one first region of the plurality of first regions from at least one other first region of the plurality of first regions.

18. The method of claim 14 wherein the substrate is provided by operations including:

providing the substrate such that it is selected from the group consisting of an insulating substrate and a semi-insulating substrate; and implanting a first dopant into each of the plurality of first regions to render it electrically conductive.

19. The method of claim 14 wherein the substrate is provided by operations including:

providing the substrate such that it is selected from the group consisting of an insulating substrate and a semi-insulating substrate; and forming the plurality of first regions on a first surface of the substrate via selective-area epitaxial growth of an electrically conductive material.

20. The method of claim 14 wherein the plurality of laser diodes is formed by operations comprising:

epitaxially growing a first cladding layer such that it is disposed on the plurality of first regions, wherein the first cladding layer has a first refractive index;

epitaxially growing a waveguide layer such that it is disposed on the first cladding layer and the first cladding layer is between the first layer and the waveguide layer, wherein the waveguide layer has a second refractive index that is higher than the first refractive index;

epitaxially growing a second cladding layer such that it is disposed on the waveguide layer, wherein the second cladding layer has a third refractive index that is lower than the second refractive index;

epitaxially growing a first layer that is electrically conductive such that the first layer is disposed on the second cladding layer; and patterning the first cladding layer, waveguide layer, second cladding layer, and first layer.

* * * * *